(12) United States Patent
Li

(10) Patent No.: US 11,374,060 B2
(45) Date of Patent: Jun. 28, 2022

(54) DISPLAY PANEL AND METHOD FOR FABRICATING SAME

(71) Applicant: Wuhan China Star Optoelectronics Semiconductor Display Technology Co., Ltd., Wuhan (CN)

(72) Inventor: Yuanhang Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 205 days.

(21) Appl. No.: 16/647,898

(22) PCT Filed: Mar. 6, 2020

(86) PCT No.: PCT/CN2020/078117
§ 371 (c)(1),
(2) Date: Mar. 17, 2020

(87) PCT Pub. No.: WO2021/042688
PCT Pub. Date: Mar. 11, 2021

(65) Prior Publication Data
US 2022/0005879 A1 Jan. 6, 2022

(30) Foreign Application Priority Data
Sep. 4, 2019 (CN) .......................... 201910832148.4

(51) Int. Cl.
*H01L 27/32* (2006.01)
*H01L 51/56* (2006.01)
*G06F 3/041* (2006.01)

(52) U.S. Cl.
CPC ........ *H01L 27/3211* (2013.01); *H01L 27/323* (2013.01); *H01L 27/3272* (2013.01);
(Continued)

(58) Field of Classification Search
CPC ............... H01L 27/3211; H01L 27/323; H01L 27/3272; H01L 51/56; H01L 27/322; G06F 3/041
See application file for complete search history.

(56) References Cited

U.S. PATENT DOCUMENTS

2016/0035795 A1  2/2016  Lim et al.
2016/0372523 A1  12/2016  Ito et al.
(Continued)

FOREIGN PATENT DOCUMENTS

CN  107204355  9/2017
CN  107887409  4/2018
CN  108153034  6/2018

*Primary Examiner* — Karen Kusumakar
*Assistant Examiner* — Adam S Bowen

(57) ABSTRACT

The present disclosure provides a display panel and a method for fabricating the same. The display panel includes a light-emitting layer, a touch layer, a light-shielding layer, a plurality of filters, and an insulating protective layer. The light-emitting layer includes a plurality of light-emitting units. The touch layer is disposed on the light-emitting layer and provided with a plurality of grooves. The grooves are disposed corresponding to the light-emitting units. The light-shielding layer is disposed on the touch layer. The filters are disposed in the grooves of the touch layer. The insulating protective layer covers the touch layer, the light-shielding layer, and the filters.

10 Claims, 1 Drawing Sheet

(52) U.S. Cl.
CPC .............. *H01L 51/56* (2013.01); *G06F 3/041* (2013.01); *H01L 27/322* (2013.01)

(56) References Cited

U.S. PATENT DOCUMENTS

| | | | |
|---|---|---|---|
| 2017/0271429 A1 | 9/2017 | Kim et al. | |
| 2018/0095566 A1* | 4/2018 | Lee | H01L 27/322 |
| 2019/0346972 A1* | 11/2019 | Wang | G06F 3/0443 |
| 2020/0012386 A1* | 1/2020 | Zhang | G06F 3/0446 |
| 2020/0064725 A1* | 2/2020 | Nozawa | G03F 1/80 |
| 2021/0103352 A1 | 4/2021 | Lee et al. | |

* cited by examiner

DISPLAY PANEL AND METHOD FOR FABRICATING SAME

RELATED APPLICATIONS

This application is a National Phase of PCT Patent Application No. PCT/CN2020/078117 having International filing date of Mar. 6, 2020, which claims the benefit of priority of Chinese Patent Application No. 201910832148.4 filed on Sep. 4, 2019. The contents of the above applications are all incorporated by reference as if fully set forth herein in their entirety.

FIELD AND BACKGROUND OF THE INVENTION

The present disclosure relates to the field of electronic displays, and particularly to a display panel and a method for fabricating the same.

In order to reduce thickness of an electronic device with a touch function, in the prior art, a touch structure is usually integrated directly on a display panel by direct on touch (DOT) technology. Compared with an external touch structure, a DOT structure is thinner and lighter and has a higher transmittance, and can be applied to a flexible display panel.

In the prior art, a DOT structure is integrated on a polarizing layer of a display panel. The polarizing layer is composed of polarizers and is configured to reduce reflectance of the display panel under strong light. Generally, thickness of each polarizer is about 100 micrometers, which is not conducive to reducing thickness of a display panel. Furthermore, the polarizers greatly reduce light extraction efficiency of the display panel, affect display effect of the display panel, and accelerates aging of the display panel.

SUMMARY OF THE INVENTION

The present disclosure provides a display panel and a method for fabricating the same to improve transmittance of the display panel and reduce thickness of the display panel.

The present disclosure provides a display panel comprising:
a light-emitting layer comprising a plurality of light-emitting units; and
a touch layer disposed on the light-emitting layer and provided with a plurality of grooves, wherein the grooves are disposed corresponding to the light-emitting units;
a light-shielding layer disposed on the touch layer;
a plurality of filters disposed in the grooves of the touch layer; and
an insulating protective layer covering the touch layer, the light-shielding layer, and the filters.

In an embodiment, the display panel further comprises an isolation layer disposed between the light emitting layer and the touch layer.

In an embodiment, the touch layer comprises:
a first metal layer disposed on the isolation layer;
a first insulating layer covering the first metal layer; and
a second metal layer disposed on the first insulating layer and electrically connected to the first metal layer through a via hole;
wherein the light-shielding layer covers the second metal layer, and
wherein projections of the grooves on a light emitting surface of the display panel do not overlap projections of the first metal layer and the second metal layer on the light emitting layer.

In an embodiment, the filters correspond to the light emitting units, a color of light retained by each filter is the same as a color of light emitted by the light emitting unit corresponding to the filter, and an edge of each filter covers an edge of the light-shielding layer adjacent to the filter.

In an embodiment, an area of the light-shielding layer is greater than an area of the second metal layer, and a projection of the light-shielding layer on the light-emitting layer overlaps the projection of the second metal layer on the light-emitting layer.

In an embodiment, a sum of areas of the grooves is greater than a sum of areas of the light emitting units.

The present disclosure further provides a method for fabricating a display panel. The method comprises:
forming a light-emitting layer comprising a plurality of light-emitting units; and
forming a touch layer on the light-emitting layer, wherein the touch layer is provided with a plurality of grooves disposed corresponding to the light-emitting units;
forming a light-shielding layer disposed on the touch layer;
forming a plurality of filters disposed in the grooves of the touch layer; and
forming an insulating protective layer covering the touch circuit layer, the light-shielding layer, and the filters.

In an embodiment, after forming the light emitting layer, the method further comprises: forming an isolation layer on the light-emitting layer.

In an embodiment, forming the touch layer and the light-shielding layer comprise:
forming a first metal layer disposed on the isolation layer;
forming a first insulating layer covering the first metal layer;
forming a second metal layer disposed on the first insulating layer and electrically connected to the first metal layer through a via hole; and
forming the light-shielding layer covering the second metal layer;
wherein projections of the grooves on a light emitting surface of the display panel do not overlap projections of the first metal layer and the second metal layer on the light emitting layer.

In an embodiment, forming the second metal layer and the light-shielding layer comprise:
forming a metal thin film covering the first insulating layer;
forming a black photoresist covering the metal thin film;
patterning the black photoresist to form the light-shielding layer; and
patterning the metal thin film by using the black photoresist as a mask to form the second metal layer.

In an embodiment, the metal thin film is patterned by dry etching, and an etching rate in a direction parallel to a surface of the metal thin film is less than or equal to an etching rate in a direction perpendicular to the surface of the metal thin film.

The present invention uses filters integrated into a touch structure to replace a polarizer in the prior art, which effectively reduces thickness of a display panel. Furthermore, because transmittance of the filters is higher than transmittance of the polarizer, the present invention effectively improves transmittance of the display panel, thereby enhancing display effect and a service life of the display panel. In addition, a metal layer in the touch structure is patterned by using a black light-shielding matrix between the filters as a mask, thereby saving a mask used for

DESCRIPTION OF SPECIFIC EMBODIMENTS OF THE INVENTION

Figure 1:
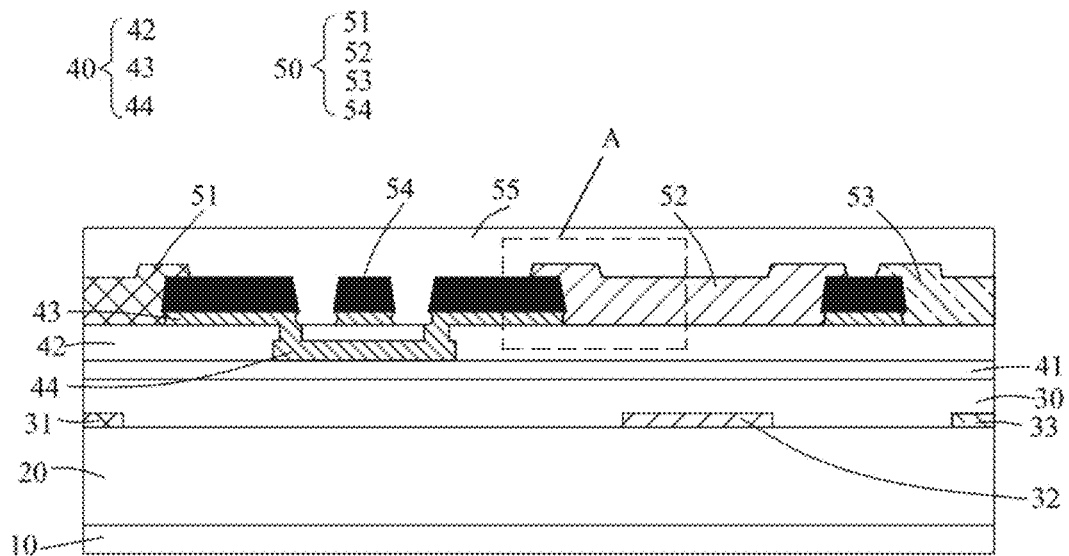
FIG. 1 is a schematic structural diagram of a display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

The present disclosure provides a display panel and a method for fabricating the same to improve transmittance of the display panel and reduce thickness of the display panel.

Figure 2:
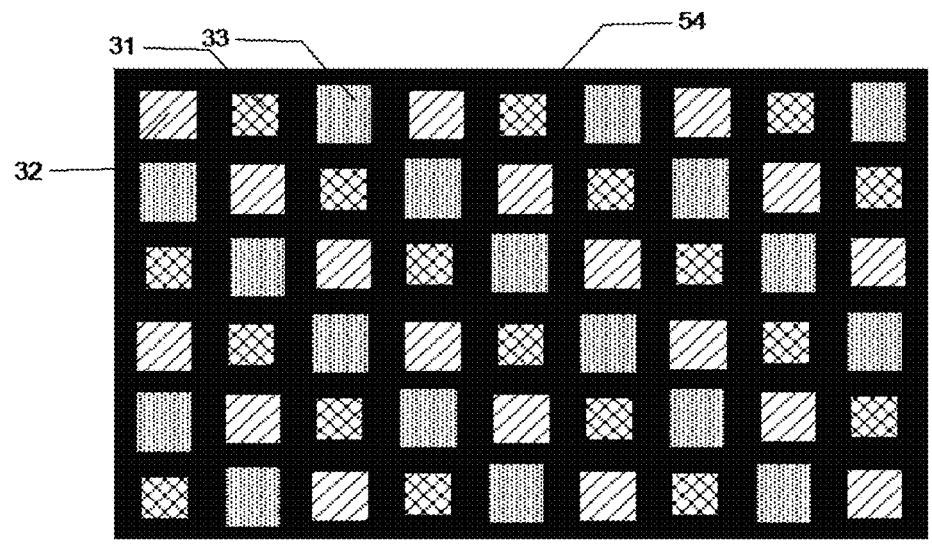
FIG. 2 is a top view of the display panel of FIG. 1.
Figure 3:
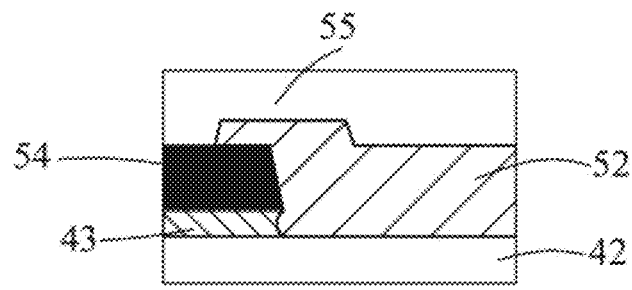
FIG. 3 is a partially enlarged view of an area A of the display panel of FIG. 1.

Please refer to FIG. 1 to FIG. 3. FIG. 1 is a schematic structural diagram of a display panel according to an embodiment of the present disclosure. FIG. 2 is a top view of the display panel of FIG. 1. FIG. 3 is a partially enlarged view of an area A of the display panel of FIG. 1. The display panel comprises a substrate 10, a thin film transistor layer 20, a light-emitting layer 30, a touch layer 40, and a filter structure 50. The touch layer 40 is disposed on the light-emitting layer 30. The filter structure 50 is integrated into the touch layer 40. In this embodiment, the display panel further comprises an isolation layer 41 disposed between the light emitting layer 30 and the touch layer 40.

In this embodiment, the light-emitting layer 30 comprises a plurality of light-emitting units. The light emitting units comprise red light emitting units 31, blue light emitting units 32, and green light emitting units 33. The light emitting units are isolated by a pixel defining layer.

The touch layer 40 comprises:

a first metal layer 44 disposed on the isolation layer 41;

a first insulating layer 42 covering the first metal layer 44; and a second metal layer 43 disposed on the first insulating layer 42 and electrically connected to the first metal layer 44 through via holes.

The touch layer 40 is provided with a plurality of grooves disposed corresponding to the light-emitting units. The light-shielding layer 54 is disposed on the second metal layer 43.

The first metal layer 44 and the second metal layer 43 may be formed of a metallic material with low electric resistance and strong oxidation resistance, such as TiAlTi or Mo, or a conductive material with high transmittance, such as indium tin oxide (ITO) or graphene. In an embodiment, the touch trace layer is preferably formed of TiAlTi or ITO.

In an embodiment, the first metal layer 44 and the second metal layer 43 are formed of TiAlTi. TiAlTi is an opaque metallic material with good conductivity. In order to prevent sides of the second metal layer 43 from reflecting light, a line width of the second metal layer 43 should be less than a line width of the above light-shielding layer 54. Please refer to FIG. 1, a line width of the second metal layer 43 is less than the line width of the light-shielding layer 54, so the second metal layer 43 and the light-shielding layer 54 form an eave-like structure. For example, if the line width of the second metal layer 43 is 3-5μm, the line width of the corresponding light-shielding layer 54 is 3.5-5.5μm. Such a width difference can be achieved by increasing an etching rate in a horizontal direction during a process of patterning the second metal layer 43.

In an embodiment, the first metal layer 44 and the second metal layer 43 are formed of ITO. Because ITO is a transparent conductive material, the sides of the second metal layer 43 do not reflect light emitted by the light-emitting layer 30. Therefore, no eave-like structure is required. In addition, compared with metallic materials, ITO has higher electric resistance and is easily broken. Therefore, the line width of the second metal layer 43 is wider than that of a second metal layer 43 formed of a metallic material. In this embodiment, the line width of the second metal layer 43 is 15-25 μm, and the line width of the light-shielding layer 54 is equal to the line width of the second metal layer 43. In this embodiment, a plurality of fractures are evenly distributed in the first metal layer 44 and the second metal layer 43 to prevent the first metal layer 44 and the second metal layer 43 from cracking and peeling due to stress during bending.

The filter structure 50 comprises a plurality of filters and a light-shielding layers 54. The filters are disposed in the grooves of the touch layer 40. The filters correspond to the light emitting units. A color of light retained by each filter is the same as a color of light emitted by the light emitting unit corresponding to the filter. For example, in this embodiment, the filter provided corresponding to a red light emitting unit 31 is a red filter 51, the filter provided corresponding to a blue light emitting unit 32 is a blue filter 52, and the filter provided corresponding to a green light emitting unit 33 is a green filter 53. An insulation protective layer 55 covers the touch layer 40, and the filter structure 50.

In this embodiment, the light-shielding layer 54 covers the second metal layer 43. The grooves are configured to set the filters, in order to ensure that the filters are located above the corresponding light emitting units. Projections of the grooves on a light emitting surface of the display panel do not overlap projections of the first metal layer and the second metal layer on the light emitting layer. A sum of areas of the grooves is greater than a sum of areas of the light emitting units.

Please refer to FIG. 2, which is a top view of the display panel of FIG. 1. The light-shielding layer 54 serves as a black matrix. The light-shielding layer 54 and the filters form the filter structure 50, which can replace a polarizer to eliminate a light reflection of the display panel under strong light. The filter structure 50 is integrated into the touch layer 40, and the light-shielding layer 54 can be used as a mask to pattern the second metal layer 43. Such a design can effectively reduce thickness of the display panel, and also save a mask used for patterning the second metal layer 43, which simplifies a fabricating method and saves fabricating costs.

To ensure a filtering effect of the filter structure 50, an edge of each filter covers an edge of the light-shielding layer 54 adjacent to the filter, as shown in FIG. 1 and FIG. 3.

In this embodiment, in order to eliminate light reflections of sides of the second metal layer 43, an area of the light-shielding layer 54 is greater than an area of the second metal layer 43, and a projection of the light-shielding layer 54 on the light-emitting layer 30 overlaps a projection of the second metal layer 43 on the light-emitting layer 30.

Please refer to FIG. 1 to FIG. 3, the present disclosure further provides a method for fabricating a display panel. The method comprises the following steps.

First, forming a light-emitting layer 30. In this embodiment, the light-emitting layer 30 comprises a plurality of light-emitting units. The light emitting units comprise red light emitting units 31, blue light emitting units 32, and green light emitting units 33. The light emitting units are isolated by a pixel defining layer.

Further, forming a touch layer 40 and a light-shielding layer 54 on the light-emitting layer 30. The touch layer 40 is provided a plurality of grooves disposed corresponding to the light-emitting units. The light-shielding layer 54 is disposed on the touch layer 40.

The first metal layer 44 and the second metal layer 43 may be formed of a metallic material with low electric resistance and strong oxidation resistance, such as TiAlTi or Mo, or a conductive material with high transmittance, such as indium tin oxide (ITO) or graphene. In an embodiment, the touch trace layer is preferably formed of TiAlTi or ITO.

In an embodiment, the first metal layer 44 and the second metal layer 43 are formed of TiAlTi. TiAlTi is an opaque metallic material with good conductivity. In order to prevent sides of the second metal layer 43 from reflecting light, a line width of the second metal layer 43 should be less than a line width of the above light-shielding layer 54. Please refer to FIG. 1, the line width of the second metal layer 43 is less than the width of the light-shielding layer 54, so the second metal layer 43 and the light-shielding layer 54 form an eave-like structure. For example, if the line width of the second metal layer 43 is 3-5µm, the line width of the corresponding light-shielding layer 54 is 3.5-5.5µm. Such a width difference can be achieved by increasing an etching rate in a horizontal direction during a process of patterning the second metal layer 43.

In an embodiment, the first metal layer 44 and the second metal layer 43 are formed of ITO. Because ITO is a transparent conductive material, the sides of the second metal layer 43 do not reflect light emitted by the light-emitting layer 30. Therefore, no eave-like structure is required. In addition, compared with metallic materials, ITO has higher electric resistance and is easily broken. Therefore, the line width of the second metal layer 43 is wider than that of a second metal layer 43 formed of a metallic material. In this embodiment, the line width of the second metal layer 43 is 15-25 µm, and the line width of the light-shielding layer 54 is equal to the line width of the second metal layer 43. In this embodiment, a plurality of fractures are evenly distributed in the first metal layer 44 and the second metal layer 43 to prevent the first metal layer 44 and the second metal layer 43 from cracking and peeling due to stress during bending.

Further, forming a filter structure 50 comprising a plurality of filters. The filters are disposed in the grooves of the touch layer 40. The filters correspond to the light emitting units. A color of light retained by each filter is the same as a color of light emitted by the light emitting unit corresponding to the filter. For example, in this embodiment, the filter provided corresponding to a red light emitting unit 31 is a red filter 51, the filter provided corresponding to a blue light emitting unit 32 is a blue filter 52, and the filter provided corresponding to a green light emitting unit 33 is a green filter 53.

Lastly, forming an insulating protective layer 55 covering the touch layer 40 and the filter structure 50.

In an embodiment, after forming the light emitting layer 30, further comprising: forming an isolation layer 41 on the light-emitting layer 30. The isolation layer 41 is configured to protect a surface of the light-emitting layer 30, thereby preventing the light-emitting layer 30 from being damaged by subsequent processes.

In an embodiment, forming the touch layer 40 and forming the light-shielding layer 54 comprise: forming a first metal layer 44 disposed on the isolation layer 41; forming a first insulating layer 42 covering the first metal layer 44; forming a second metal layer 43 disposed on the first insulating layer 42 and electrically connected to the first metal layer 44 through a via hole; and forming the light-shielding layer 54 covering the second metal layer 43. Projections of the grooves on a light emitting surface of the display panel do not overlap projections of the first metal layer 44 and the second metal layer 43 on the light emitting layer 30.

In an embodiment, forming the second metal layer 43 and the light-shielding layer 54 comprise: forming a metal thin film covering the first insulating layer 42; forming a black photoresist covering the metal thin film; patterning the black photoresist to form the light-shielding layer 54; and patterning the metal thin film by using the black photoresist as a mask to form the second metal layer 43.

The light-shielding layer 54 serves as a black matrix. The light-shielding layer 54 and the filters form the filter structure 50, which can replace a polarizer to eliminate a light reflection of the display panel under strong light. The filter structure 50 is integrated into the touch layer 40, and the light-shielding layer 54 can be used as a mask to pattern the second metal layer 43. Such a design can effectively reduce thickness of the display panel, and also save a mask used for patterning the second metal layer 43, which simplifies a fabricating method and saves fabricating costs.

In an embodiment, the metal thin film is patterned by dry etching. An etching rate in a direction parallel to a surface of the metal thin film is less than or equal to an etching rate in a direction perpendicular to the surface of the metal thin film. Etching in a horizontal direction can make a line width of the second metal layer 43 less than a line width of the light-shielding layer 54. Therefore, an area of the light-shielding layer 54 is greater than an area of the second metal layer 43, and a projection of the light-shielding layer 54 on the light-emitting layer 30 overlaps a projection of the second metal layer 43 on the light-emitting layer 30. Such a design can eliminate light reflections of sides of the second metal layer 43.

The present invention uses filters integrated into a touch structure to replace a polarizer in the prior art, which effectively reduces thickness of a display panel. Furthermore, because transmittances of the filters are higher than transmittance of the polarizer, the present invention effectively improves transmittance of the display panel, thereby enhancing display effect and a service life of the display panel. In addition, a metal layer in the touch structure is patterned by using a black light-shielding matrix between the filters as a mask, thereby reducing a mask used to pattern the metal layer. This can simplify a fabricating method and save fabricating costs.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A display panel, comprising:
   a light-emitting layer comprising a plurality of light-emitting units; and
   a touch layer disposed on the light-emitting layer, provided with a plurality of grooves corresponding to the light-emitting units, and comprising a first metal layer, a first insulating layer, and a second metal layer stacked in sequence, wherein each of the light-emitting units is located within a projection of one corresponding groove on the light emitting layer, a projection of the first metal layer and the second metal layer on the light emitting layer does not overlap a projection of the grooves on the light emitting layer, and the first metal layer and the second metal layer is made of a metallic material;
   a light-shielding layer covering the second metal layer; and
   a plurality of filters disposed in the grooves of the touch layer.

2. The display panel according to claim 1, wherein the display panel further comprises an isolation layer disposed between the light emitting layer and the touch layer.

3. The display panel according to claim 1, wherein the filters disposed corresponding to the light emitting units, a color of light retained by each of the filters is same as a color of a light emitted by one corresponding light emitting unit, and an edge of each of the filters covers an edge of one adjacent light-shielding layer.

4. The display panel according to claim 1, wherein an area of the light-shielding layer is greater than an area of the second metal layer, and a projection of the light-shielding layer on the light-emitting layer overlaps a projection of the second metal layer on the light-emitting layer.

5. The display panel according to claim 1, wherein a sum of areas of the grooves is greater than a sum of areas of the light emitting units.

6. A method for fabricating a display panel, comprising:
   forming a light-emitting layer comprising a plurality of light-emitting units; and
   forming a touch layer on the light-emitting layer, wherein the touch layer is provided with a plurality of grooves corresponding to the light-emitting units and comprises a first metal layer, a first insulating layer, and a second metal layer stacked in sequence, each of the light-emitting units is located within a projection of one corresponding groove on the light emitting layer, a projection of the first metal layer and the second metal layer on the light emitting layer does not overlap a projection of the grooves on the light emitting layer, and the first metal layer and the second metal layer is made of a metallic material;
   forming a light-shielding layer covering the second metal layer; and
   forming a plurality of filters disposed in the grooves of the touch layer.

7. The method for fabricating the display panel according to claim 6, after the forming the light emitting layer, further comprising: forming an isolation layer on the light-emitting layer.

8. The method for fabricating the display panel according to claim 7, wherein forming the touch layer comprise:
   forming the first metal layer on the isolation layer;
   forming the first insulating layer covering the first metal layer and the isolation layer; and
   forming the second metal layer on the first insulating layer.

9. The method for fabricating the display panel according to claim 8, wherein the forming the second metal layer and the forming the light-shielding layer comprise:
   forming a metal thin film covering the first insulating layer;
   forming a black photoresist covering the metal thin film;
   patterning the black photoresist to form the light-shielding layer; and
   patterning the metal thin film by using the light-shielding layer as a mask to form the second metal layer.

10. The method for fabricating the display panel according to claim 9, wherein the metal thin film is patterned by dry etching, and an etching rate in a direction parallel to a surface of the metal thin film is less than or equal to an etching rate in a direction perpendicular to the surface of the metal thin film.

* * * * *